United States Patent [19]

Rote

[11] 4,018,414
[45] Apr. 19, 1977

[54] HOLDING FIXTURE
[75] Inventor: Everett Arthur Rote, Corona, Calif.
[73] Assignee: Xerox Corporation, Stamford, Conn.
[22] Filed: Aug. 7, 1975
[21] Appl. No.: 602,701
[52] U.S. Cl. .................. 248/317; 269/47; 294/1 R; 294/86 R
[51] Int. Cl.² ........................................ B42F 13/00
[58] Field of Search .......... 16/114 R, 124; 24/154, 24/201 R; 29/203 H, 203 HM, 203 HC, 203 B; 40/23 A; 204/297 R, 297 W; 211/41, 113; 224/45 K, 45 P, 45 T; 228/36–40, 58; 248/317, 339–341; 269/46, 47, 321 WE; 294/1 R, 27 R, 27 H, 33, 81 R, 86 R, 86 H, DIG. 1

[56] References Cited

UNITED STATES PATENTS

| | | | |
|---|---|---|---|
| 971,432 | 9/1910 | Eisner | 16/124 UX |
| 1,773,042 | 8/1930 | Jones | 294/86 R |
| 1,840,169 | 1/1932 | Nash | 269/47 X |
| 2,508,091 | 5/1950 | Benbow | 248/317 X |
| 2,800,089 | 7/1957 | Seils | 16/114 R X |
| 2,839,671 | 6/1958 | Cullen | 248/317 UX |
| 2,893,777 | 7/1959 | O'Neill et al. | 294/86 R X |
| 3,277,566 | 10/1966 | Christensen | 228/36 UX |
| 3,298,945 | 1/1967 | Weis et al. | 204/297 R X |
| 3,359,132 | 12/1967 | Wittmann | 228/36 X |
| 3,429,786 | 2/1969 | Kubik | 204/297 W X |
| 3,626,575 | 12/1971 | Greenspan | 29/203 H |
| 3,759,436 | 9/1973 | Foster et al. | 228/57 |

FOREIGN PATENTS OR APPLICATIONS

| | | | |
|---|---|---|---|
| 40,431 | 3/1932 | France | 24/154 |
| 611,708 | 10/1960 | Italy | 211/41 R |
| 1,254,496 | 11/1971 | United Kingdom | 248/317 |
| 837,380 | 6/1960 | United Kingdom | 294/1 R |

OTHER PUBLICATIONS

Milo, *Western Electric Tech. Digest*, "Supporting Rack for PC Boards", Oct. 1970, p. 51.

Primary Examiner—Lawrence J. Staab
Attorney, Agent, or Firm—James J. Ralabate; Allen S. Melser; Franklyn C. Weiss

[57] ABSTRACT

A holding device for holding a printed circuit board or other flat plate-like article having a supporting body and a pair of legs extending therefrom to which the article is attached. The attaching means comprises, on each leg, a transverse groove and a notch forming two lips, the outwardly disposed lip having a pin thereon which extends through the article to be supported.

3 Claims, 2 Drawing Figures

HOLDING FIXTURE

BACKGROUND OF THE INVENTION

1. Field of the Invention

This invention relates to clamping or holding devices, and more particularly to a device for supporting a printed circuit board or other flat plate-like article in a partially rigid manner. The device may be used, for example, to hold a printed circuit board while the circuit board is lowered into a pool of molten solder to apply a solder coating to the conductive areas of the board and to the through-holes of the board.

2. Description of the Prior Art

In the past, when it was desired to use a solder leveling technique utilizing a pool of molten solder into which a printed circuit board may be lowered and subsequently raised, boards were attached to a holding fixture by means of bolts or other similar means which are time consuming and difficult to operate in a manufacturing environment. The mounting mechanism had to be somewhat rigid as the printed circuit board, being lighter than the molten solder, tended to float as the board was being lowered into the pool of solder. Thus, the mounting mechanism had to be somewhat rigid, although not completely so, to prevent the bottom edge of the board from floating upward as the board was lowered into the molten solder.

SUMMARY OF THE INVENTION

The instant invention overcomes the problems of the prior art clamping or holding devices by providing a supporting body with a pair of legs extending therefrom, the legs having a thickness somewhat greater than the thickness of the article to be supported. A deep groove is provided transversely across the width of the leg, and a notch is provided perpendicular to the groove to form a pair of lips. The outwardmost of the lips is provided with a pin which extends through or partially through a pair of holes drilled in the printed circuit board.

DETAILED DESCRIPTION OF THE PREFERRED EMBODIMENT

Figures 1, 2:
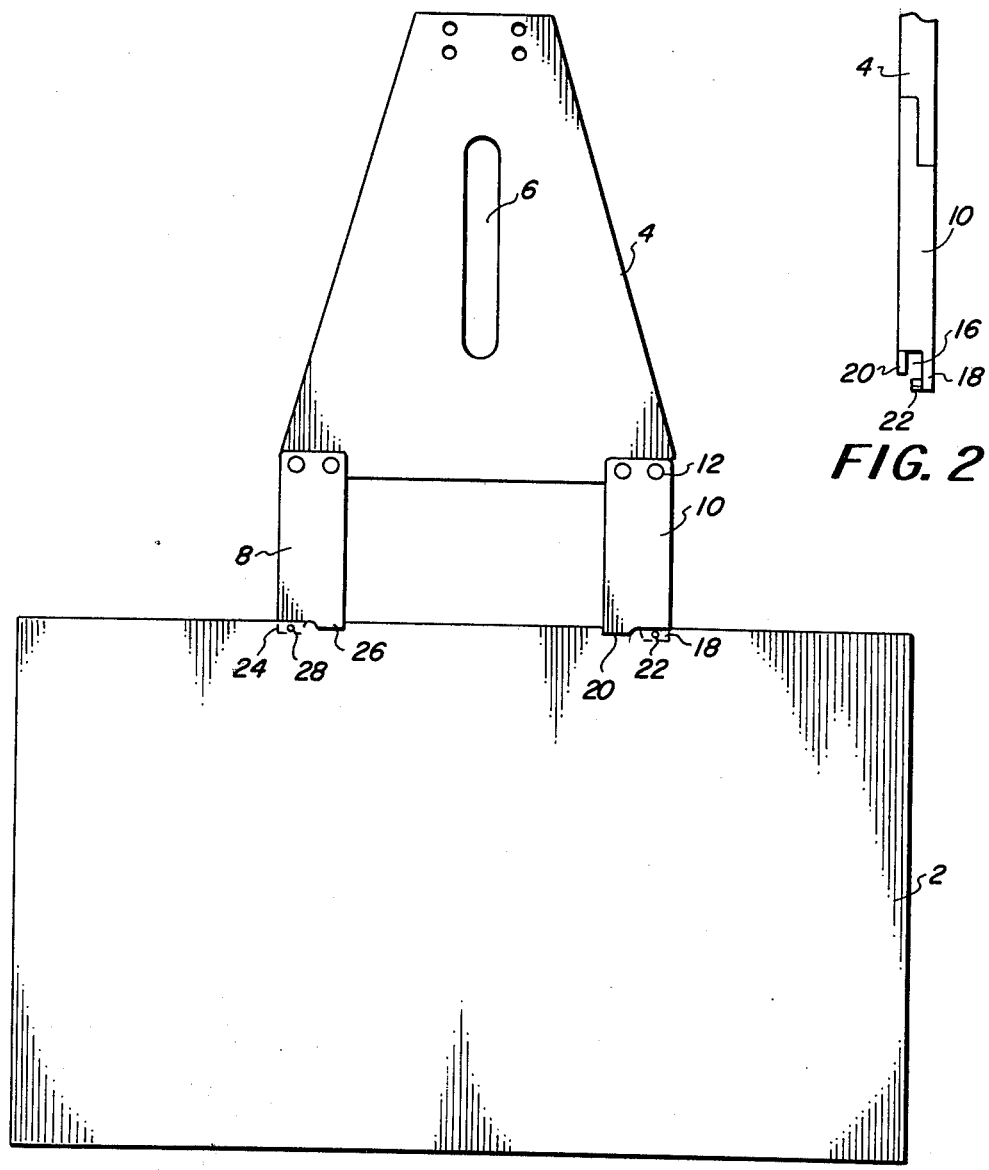
FIG. 1 is a front view of a holder according to the instant invention together with a printed circuit board being supported by the holder.
FIG. 2 is a side view of one of the legs extending from the support member for holding the printed circuit board.

Figure 1 shows a front view of a clamping or holding fixture for supporting a printed circuit board 2 or other flat article. The fixture comprises a supporting member 4 which may be of a suitable material such as steel according to the use which the fixture is intended. In a preferred embodiment, the fixture is utilized to lower and raise a printed circuit board into and from a pool of molten solder. Therefore, the support member should be of a material able to withstand relatively high temperatures (on the order of 450° Farenheit) without deterioration. The supporting portion of the fixture 4 is not subjected directly to the molten solder in the intended use.

The supporting fixture 4 may be attached to a raising and lowering member by means of the slot 6 and an appropriate clamping or holding mechanism to attach the fixture to a machine. A pair of legs are attached to the supporting member 4 by means of bolts, wells, or other suitable means shown at 12. The legs 8 and 10 are directly subjected to the molten solder and must be of a material able to withstand the heat thereof. Further, it is desirable that a material be used for legs 8 and 10 to which molten solder will not adhere. Titanium has been found to be suitable material although other materials may additionally be found suitable.

Figure 2 shows a side view of one of the legs 10. At the bottom of the leg a deep transverse groove 16 is cut or machines into the legs. The groove extends the entire width of the leg 10. Additionally, material is removed from the leg 10 and particularly on the right side thereof from the front of the lip formed by the groove 16, and on the left or innermost side of leg 10 from the rear lip as formed by groove 16. The result of that removal is a pair of lips 18 and 20 each extending somewhat less than half the total width of leg 10. The lip 18 is additionally provided with a pin 22 which extends outwardly from the back lip 18 toward the front. A similar machining or cutting operation is performed on leg 8 to form a mirror image of the groove and lip arrangement of leg 10, the outer lip, bearing a pin 28 is shown at 24, and the innermost lip at 26.

In operation, a printed circuit board 2 with holes drilled to match the location of pins 22, 28 is mounted on the board by inserting one of the pins 28 into one of the holes, with the board, in a front view, convering lip 24 and passing behind lip 26.

The board edge is then moved directly behind lip 20 and by a very slight flexing of the board the other pin 22 may be inserted into its corresponding hole on the circuit board as that edge of the circuit board passes in front of the lip 18. Removal of the board is the direct opposite operation to the attachment, that is, the board is flexed slightly forward (as shown in FIG. 1) at one edge to release pin 22 from its corresponding hole in the printed circuit board. The board is then dropped slightly on that edge and pushed slightly backwardly to disengage the board from the opposite lips 24 and 26 and allow removal of the board from the other pin 28.

The dimensions of the device are not critical and may be of any convenient size to handle a supported article conveniently. By way of example, in a preferred embodiment, each leg may be one and one-half inches wide with the pin-bearing lip being approximately one-half inch wide and the non pin-bearing lip being approximately one-quarter inch wide. The leg may be approximately three-eights of one inch thick with the pin-bearing lip being approximately one-eights inch thick. The pin may extend an additional one-eights inch from the lip.

While the invention has been described with respect to a specific embodiment thereof, it is understood that alternatives may occur to those skilled in the art. The invention therefore, should be limited only by the scope of the claims appended hereto.

What is claimed is:

1. A board holding fixture comprising:
   a. a supporting member
   b. said supporting member having a first and second extension connected thereto,
   c. each of said first and second extensions having a transverse groove therein to form a pair of flanges,
   d. a notch cut into one of the flanges formed by said transverse groove on each extension to form a lip, e. a notch cut into the other of said flanges on each extension to form a second lip,
f. each of said lips being horizontally displaced relative to the other,
g. a pin mounted on one of said lips on each extension onto which pins the board is mounted.

2. A fixture for holding a flat plate comprising:
a. a supporting body,
b. a first extension and a second extension attached at one end to said supporting body,
c. said first and second extensions rectangular in shape and having a thickness of less than the width and height dimensions of said extensions but greater than the thickness of the plate to be held,
d. said first and second extensions each comprising first and second horizontally displaced lips at the end opposite the supporting body,
e. said first and second lips forming a transverse groove into which said plate is inserted,
f. said first lips having holding means in the form of pins mounted thereon for extending into said plate.

3. A board holding fixture comprising:
a. a supporting member,
b. said supporting member having a first and second extension connected thereto,
c. each of said first and second extensions having a transverse groove therein to form a pair of flanges,
d. a notch cut into one of the flanges formed by said transverse groove on each extension to form a lip,
e. a notch cut into the other of said flanges on each extension to form a second lip,
f. a pin mounted on one of said lips on each extension onto which pins the board is mounted,
g. each of said lips being horizontally displaced relative to each other, with the innermost lips being formed without pins and the outermost lips being formed each with a pin.

* * * * *